United States Patent [19]

Washizuka et al.

[11] 4,412,210
[45] Oct. 25, 1983

[54] ELECTRONIC CALCULATOR WITH ACOUSTIC CONFIRMATION OF KEY ACTUATION AND ACOUSTICAL ALARMS

[75] Inventors: Isamu Washizuka, Soraku; Shintaro Hashimoto, Shiki, both of Japan

[73] Assignee: Sharp Kabushiki Kaisha, Osaka, Japan

[21] Appl. No.: 283,978

[22] Filed: Jul. 16, 1981

Related U.S. Application Data

[63] Continuation of Ser. No. 845,977, Oct. 27, 1977, abandoned.

[30] Foreign Application Priority Data

Nov. 1, 1976 [JP] Japan .......................... 51-147436[U]

[51] Int. Cl.³ ............................................. G06F 3/02
[52] U.S. Cl. ............................ 340/365 S; 340/365 R; 340/365 E; 340/384 R; 364/709; 364/737
[58] Field of Search ............ 340/365 R, 365 S, 365 E, 340/384 R, 384 E; 364/700, 705, 709, 710, 735

[56] References Cited

U.S. PATENT DOCUMENTS

| | | | |
|---|---|---|---|
| 3,588,875 | 6/1971 | Gabor | 340/365 S |
| 3,715,746 | 2/1973 | Hatano | 340/365 S |
| 3,932,866 | 1/1976 | Sasaki | 340/365 E |
| 3,973,255 | 8/1976 | Freeman | 340/365 E |
| 3,978,474 | 8/1976 | Engstrom | 340/365 E |
| 4,014,016 | 3/1977 | Sherritt et al. | 340/365 R |
| 4,020,467 | 4/1977 | Hashimoto et al. | 340/365 S |
| 4,037,200 | 7/1977 | Cranmer | 340/365 R |

OTHER PUBLICATIONS

"A Step-by-Step Introduction to 8080 Microprocessor Systems", 1977; pp. 1-4 and 129-135.
"Programming Microprocessors", Mar. 1977; pp. 10-13.
"Motorola Series In Solid-State Electronics", Dec. 1, 1975; pp. Preface, 4-88, 7-72.
"Designing With Microprocessors", Nov. 16, 1976; pp. 1-15 to 1-18.
"Applying Microprocessors-New Hardware, Software and Applications"; Jun. 6; 1977; pp. 3-18.

*Primary Examiner*—James J. Groody
*Attorney, Agent, or Firm*—Birch, Stewart, Kolasch & Birch

[57] ABSTRACT

An electronic calculator is provided which generates confirmation sounds identifying actual depression of any keys of a keyboard. The calculator includes a piezoelectric acoustic element which is responsive to key signals derived from a processor unit when any keys of the keyboard are manually operated. The calculator generates these sounds only for a fixed period of time starting with actual depression of any keys. The processor unit generates key-strobe signals which are input to the keys on the keyboard. Each key has its own key-strobe signal, and, when depressed, the signal is passed to the processor uniquely identifying each key. The processor generates sound instruction signals indicative of normal and erroneous operational states in the calculator in accordance with the received key-strobe signals. An audible confirmation or alarm sound is then generated in accordance with the sound instruction signal.

2 Claims, 4 Drawing Figures

ELECTRONIC CALCULATOR WITH ACOUSTIC CONFIRMATION OF KEY ACTUATION AND ACOUSTICAL ALARMS

This application is a continuation of copending application Ser. No. 845,977, filed on Oct. 27, 1977 now abandoned.

BACKGROUND OF THE INVENTION

The present invention relates to an electronic calculator with the capability of sounding an acoustic alarm capabilities.

In a prior art electronic calculator having a visual display means, there is a substantial probability that the operator may overlook erroneous states such as an overflow or an incorrect key operation while reading account books or sales slips and introducing information via a keyboard. In the case where it takes a considerable amount of time to perform complex calculations, for example, functional calculations, the operator might inadvertently operate a wrong key to render the entire key operations of calculations invalid.

SUMMARY OF THE INVENTION

Accordingly, it is an object of the present invention to provide an electronic calculator which can generate sounds while manually operating a keyboard, and to notify the operator via acoustic alarms that key operation are being processed as invalid while the alarm sounds are being generated.

It is another object of the present invention to provide an electronic calculator which can make alarm sounds either periodically or successively.

It is still a further object of the present invention to provide an electronic calculator which can make an alarm sound for a given period of time by virtue of an automatic clearing function which will be excited when power is initiated.

It is another object of the present invention to provide an electronic calculator with an extremely small stroke keyboard which can make an alarm sound for a given period of time (regardless of a period of time by which a key is actually operated by the operator,) the alarm being generated by a signal which is derived from a processor unit immediately after such key operation, for the purposes of identifying actual depression of any keys of the keyboard.

It is still a further object of the present invention to provide an electronic calculator which can operate selectively either in an acoustically alarming mode and a non-acoustically alarming mode.

It is a further object of the present invention to provide an electronic calculator which can elminate an alarm sound derived from a speaker when an earphone is used.

BRIEF DESCRIPTION OF THE DRAWINGS

Other objects and novel features of the present invention are set forth in the appended claims and the present invention as to its organization and its mode of operation will best be understood from a consideration of the following detailed description of the preferred embodiments taken in connection with accompanying drawings, wherein:

DETAILED DESCRIPTION OF THE INVENTION

Figure 1:
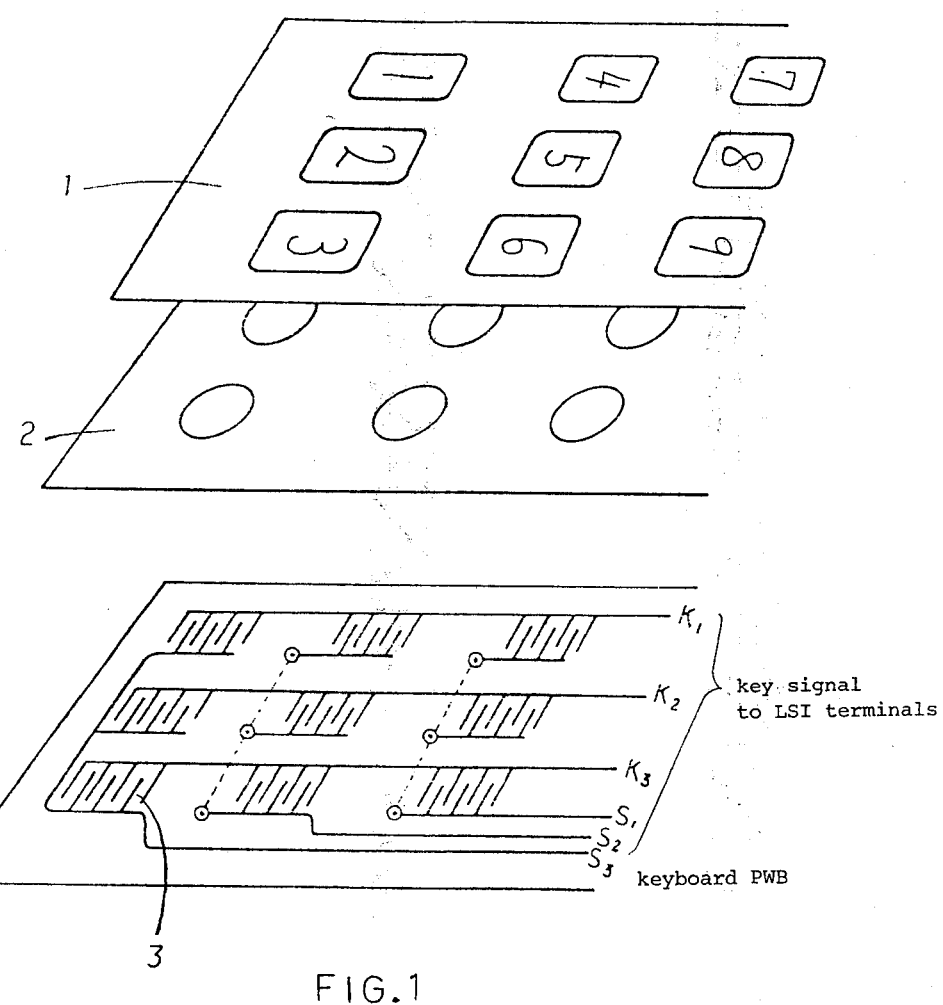
FIG. 1 is an exploded perspective view of a keyboard used with the present invention.

Referring now to FIG. 1, there is illustrated a keyboard scheme of an electronic calculator used with the present invention. The body of the electronic calculator (although not shown) is surrounded wholly or partially by a single flexible sheet 1 such as cloth or leather, a plurality of limited regions of the flexible sheet being given unique symbols or indicators corresponding to respective ones of keys of the keyboard scheme. Thus, the flexible sheet 1 serves as manually operable key tops or actuators. A spacer member 2 is positioned beneath the flexible sheet 1, having a plurality of discrete elastomeric contact members in positions to correspond to the symbol or indicator regions of the flexible sheet 1. When a specific region of the flexible sheet 1 is manually operated, its associated elastomeric contact member will come into contact with a comb-configured contact member formed on a printed circuit board PWB. With such an arrangement, an extremely small amount of a stroke of approximately 0.2 mm can cause the elastomeric contact member to contact the comb-configured contact member. Details of the above-described keyboard scheme are shown and disclosed in U.S. patent application Ser. No. 843,047 entitled "AN ELECTRONIC CALCULATOR WITH NO PROTRUDING KEY TOPS", filed Oct. 17, 1977, and assigned to the same assignee as the present application, which is incorporated herein by reference.

In contrast, a conventional keyboard scheme needed at least a stroke of 1 through 2 mm to effect switching performances by the motion of a spring or the cam snaped action. In this instance, the operator could confirm actual depression of any keys by the sense of touch.

Nevertheless, with the extremely small stroke keyboard as stated above, it is too difficult to confirm whether any keys have been actually operated, thereby providing the operator with anxiety about the accuracy of his introduced information. In accordance with the teachings of the present invention, the question regarding whether any keys have been actually operated can be confirmed or determined acoustically even in the case of an extremely small stroke keyboard as above described or any touch type keyboards having no key stroke.

Figure 2:
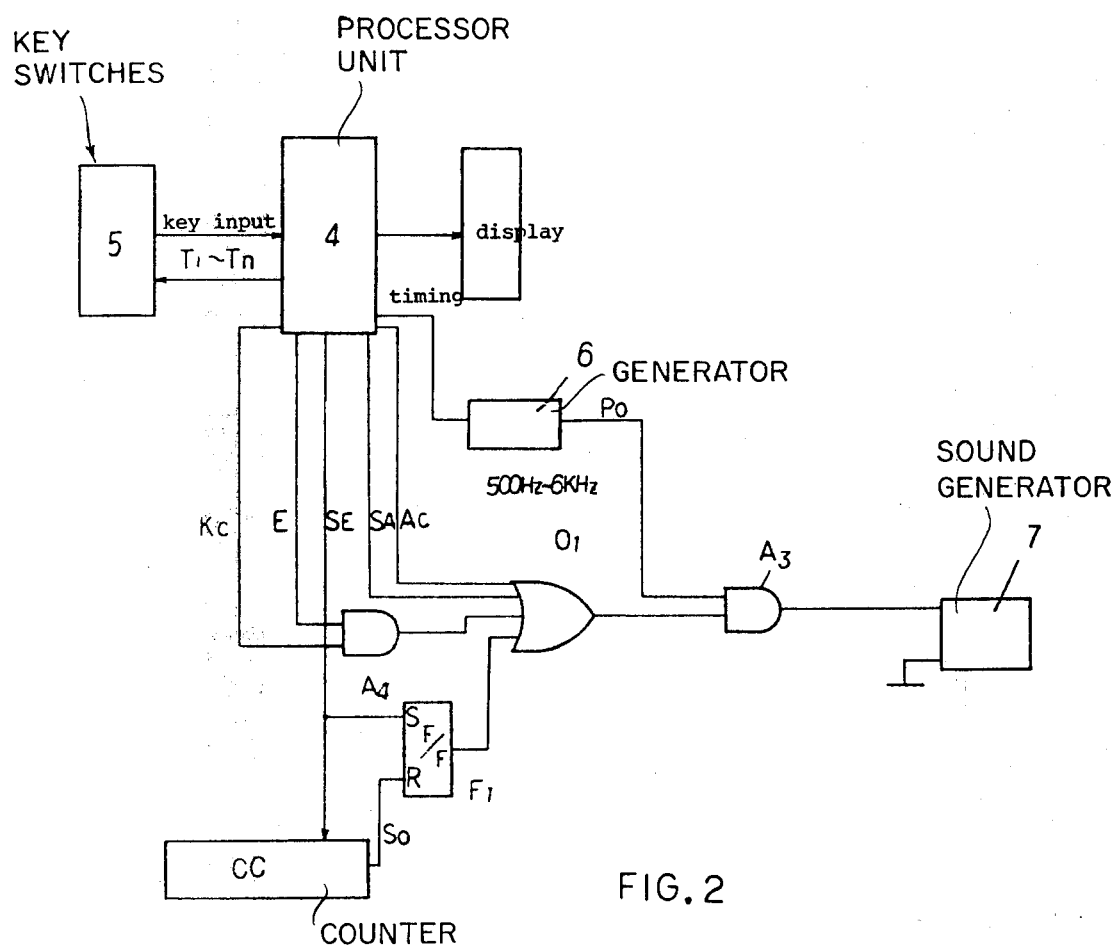
FIGS. 2 and 3 are circuit diagrams of a circuit arrangement necessary to generate alarm sounds in accordance with the present invention.

FIG. 2 illustrates a circuit effective to generate alarm sounds when any keys are operated. As is well known in the art of an electronic calculator, a processor unit 4 provides a sequence of key strobe signals or timing signals $T_1$-$T_n$ for the purpose of obtaining keyed information. The respective strobe signals are coupled with one terminals of key switches 5 of which the remaining terminal return the key strobe or timing signals back to the processor unit 4 only when the respective keys are operated. Then, the processor unit determines which keys were actually operated.

Figure 3:
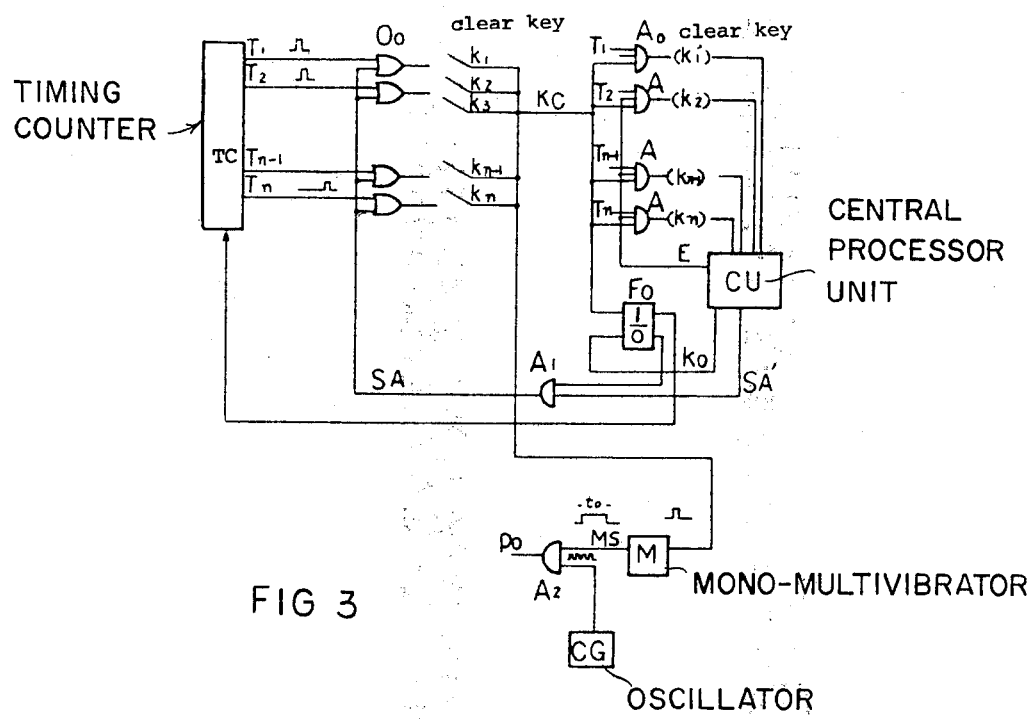

In FIG. 3, there is illustrated an approach to a sound generator circuit responsive to the timing signals derived from the processor unit upon key depression.

The illustrative example is adapted to quickly determine which keys $K_1$-$K_n$ have been operated using a timing signal counter TC provided for other purposes. The central processor unit CU generates a signal SA which assumes a high level at all times during a display mode of operation and assumes a low level during an arithmetic calculation mode of operation. The signal SA is supplied to one terminal of each of the keys via OR gates Oo of which the remaining inputs receive the outputs of the timing signal counter TC. As stated earlier, the signal SA assumes a high level because Ko is HIGH, a flip-flop Fo initially placed into the reset state and SA' is HIGH. Therefore, if a specific key is operated, commonly connected terminals KC of the keys are at the high level so that the flip flop Fo is switched to the set state and the counter TC starts counting and generating the timing signals TC in the order of $T_1$, $T_2$, . . . . Under these circumstances, the timing signal associated with the specific key is developed at Kc if that timing signal is reached in the sequence of the timing signals. This causes its associated AND gate Ao to be turned ON. The identity of that operated key is provided by identifying which of the AND gates present are in the ON state. The output of Ao is transferred into the processor unit CU. In response to any Ao in the ON state, the processor unit CU provides the signal Ko and resets the flip flop Fo. An AND gate $A_1$ prevents the succeeding generation of SA and inhibits the counter TC to operate.

Whether any key is depressed is checked by Kc. In other words, Kc always assumes a low level when no key is depressed, and changes from the low lever to a high level when a key is depressed. Such change in Kc is sensed by a mono-multivibrator M which is turn provides a signal MS of a given width $t_o$.

Of course, Kc is changed from LOW to HIGH upon development of the next succeeding timing signals. Since the output MS of the mono-multivibrator M is long enough for the operator to hear it provided that it is in the form of an acoustic signal, variations in the input to the multivibrator M within the period $t_o$ have no influence on the operation of the multivibrator M.

The output of the multivibrator is a signal having a fixed period of time starting with depression of the keys. When a sound generating means requires a frequency signal of for example 500 Hz-6 KHZ, an oscillator CG should provide such frequency signal which in turn is applied to an AND gate $A_2$ for the purposes of generating a sound generating signal Po.

Referring to FIG. 2, various states of the electronic calculator desired to be alarmed acoustically are described. The sound generating signal Po is created in a generator 6 in response to the timing signal generated from the processor unit 4. When it is generated to make alarm sounds, a signal SA' indicative of an arithmetic operation mode or a key entry mode is supplied via a gate $O_1$ to a gate $A_3$ which then supplies a signal Po to the sound generator 7. The sound generator 7 may be a speaker or a piezo-electro acoustic element. The latter is commercially available, for example, EFB-S46C04 manufactured by Matsushita Electric Industrial Co. of Japan, which comprises a thin plate of metal and a layer of PCM piezo-electro ceramics adhered onto the metal plate.

An error signal E and a key input signal KC are applied to a gate $A_4$. Since with such an arrangement illustrated in FIG. 3 any key input other than that from a clear key is not supplied to the processor unit CU in the presence of an error E incurred within the calculator, KC is kept HIGH such that the generator 7 continues generating an acoustic signal until the clear key is depressed. In other words, the generator 7 goes on generating an acoustic signal during a period from depression of any keys other than the clear key through the release thereof.

A start signal SE sets the flip flop $F_1$ and starts operation of the cunter CC whereas a counting end signal So resets the flip flop $F_1$. In this case the output of the flip flop $F_1$ extends for a given period of time and, therefore, an acoustic sound signal can be provided for the same period of time as that of the output of the flipflop $F_1$ provided that the output is supplied via a loop including $O_1$, $A_3$ and 7.

A reset output of the flip flop $F_1$ may be used for this purpose, although not shown.

Figure 4:
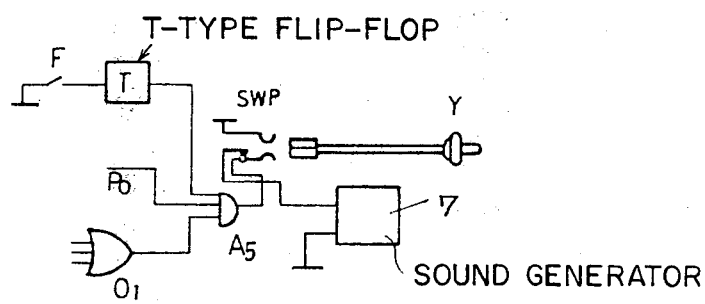
FIG. 4 is a circuit diagram of a circuit necessary to reset a sound generating element in accordance with the present invention.

FIG. 4 shows a circuit arrangement effective to optionally reset the sound generator 7. A switch F is provided to excite a T type flip flop T which turns OFF an AND gate $A_5$ when in the reset state. Accordingly, the signal Po is not sent to the sound generator or speaker 7. Alternatively, when an earphone Y is placed into a plug-in receptable SWP, the output of $A_5$ is isolated from the sound generator 7 but transmitted into the earphone Y.

Upon removal of the earphone $A_5$ is connected to the speaker 7. The designation $O_1$ is similar to $O_1$ of FIG. 2.

Meritorious effects of the present invention are expected in the following aspects of operation of an electronic calculator.

1. Recent calculators have been adapted to suppress a visual display while performing arithmetic operations, or to provide a visual display each time each of steps of arithmetic operations is terminated. More particularly, in case where functional calculators, program calculators, etc., need much time to effect arithmetic operations, the operator can make sure whether the calculator is in the arithmetic operation mode or the key entry mode, without viewing a digital display provided in the calculator.

2. In the past, in case when a calculator stands in the erroneous state, the operator was informed of such state visually or acoustically at all times when the calculator is in the erroneous state. In the event that the operator pushes any key inadvertently despite the erroneous state it is extremely difficult to determine a point in time where such erroneous state has occurred. Nevertheless, such erroneous state can be recognized easily provided that the acoustic signal is derived only when any key is depressed after the erroneous state has occurred as taught by the present invention.

3. As a rule, a calculator has the automatic cleaning function which starts when power is provided. The operator sometimes operates digit keys or function keys before the calculator not automatically cleared. However, in accordance with the present invention, the acoustic signal is derived only when the calculator is being automatically cleared, thereby indicating the operator is not to operate any keys at this time.

4. In accordance with the present invention, an acoustic sound signal indicative of the arithmetic operation mode can be selected to be much longer than that indicative of the key entry mode. Therefore, when the calculator is being processed in the arithmetic operation mode, a longer audible sound will distinguish between this mode and the normal sound signal indicative of actual depression of any keys.

5. When the surrounding environment atmosphere is quiet, the operator can use an earphone.

While only certain embodiments of the present invention have been described, it will be apparent to those skilled in the art that various changes and modification may be made therein without departing from the spirit and scope of the invention as claimed.

What is claimed is:

1. An electronic data processor apparatus including a substantially flat keyboard, said data processor being capable of audibly confirming whether any key on said substantially flat keyboard has been actuated, thereby introducing an input into said electronic data processor apparatus, said electronic data processor apparatus further comprising:

a substantially flat keyboard means responsive to the actuation of the keys on said keyboard for introducing inputs into said data processor apparatus, said substantially flat keyboard means including a predetermined number of keys grouped in respective key working areas which lie substantially in a plane, said keys on said keyboard capable of being actuated by depression of each of said keys through a substantially miniscule key stroke distance;

a processor unit means including a processor circuit means for performing an operation on said inputs, said processor unit means including a signal generator means for generating a plurality of key strobe signals, said key strobe signals being input to each of said keys on said substantially flat keyboard means, said respective keys which receive said key strobe signals passing said respective key strobe signals to said processor unit means in response to actuation of said respective keys, said processor unit means further generating a sound instruction signal indicative of the actuation of said respective keys and of the introduction of said inputs into said data processor apparatus, said sound instruction signal being generated in accordance with the receipt of said respective key strobe signals; and means resposive to said sound instruction signal for generating an acoustic sound in accordance with said sound instruction signal, thereby confirming audibly whether any key on said substantially flat keyboard means has been actually actuated and whether said inputs introduced in response to said actuation.

2. The electronic calculator as set forth in claim 1 further comprising a multivibrator means responsive to actuation of any of said keys on said keyboard for converting said sound instruction signal into a pulse having a given pulse width, the pulse width being determined by the characteristic of said multivibrator.

* * * * *